(12) United States Patent
Chew et al.

(10) Patent No.: US 8,693,158 B2
(45) Date of Patent: Apr. 8, 2014

(54) COMPACT ELECTRONIC REVERBERATION CHAMBER

(75) Inventors: Weng Cho Chew, Hong Kong (CN); Bo Zhu, Hong Kong (CN); Lijun Jiang, Hong Kong (CN); Qi Dai, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 19 days.

(21) Appl. No.: 13/353,116

(22) Filed: Jan. 18, 2012

(65) Prior Publication Data

US 2012/0206849 A1 Aug. 16, 2012

Related U.S. Application Data

(60) Provisional application No. 61/433,816, filed on Jan. 18, 2011.

(51) Int. Cl.
*H01H 47/00* (2006.01)
*G01R 27/32* (2006.01)

(52) U.S. Cl.
USPC .......................................... 361/139; 324/636

(58) Field of Classification Search
USPC .......................................... 361/139; 324/636
See application file for complete search history.

(56) References Cited

U.S. PATENT DOCUMENTS

| | | | |
|---|---|---|---|
| 6,885,265 B2 * | 4/2005 | Li et al. | 333/227 |
| 7,105,787 B2 * | 9/2006 | Clemen, Jr. | 219/702 |
| 7,554,339 B2 * | 6/2009 | Horton et al. | 324/627 |
| 2008/0056340 A1 * | 3/2008 | Foegelle | 375/224 |
| 2010/0231232 A1 * | 9/2010 | Jackson et al. | 324/612 |
| 2011/0263215 A1 * | 10/2011 | Asplund et al. | 455/115.1 |
| 2013/0050006 A1 * | 2/2013 | Sim | 342/4 |

* cited by examiner

*Primary Examiner* — Scott Bauer
(74) *Attorney, Agent, or Firm* — Leason Ellis LLP.

(57) ABSTRACT

A method and apparatus provide an improved EM reverberation chamber which facilitates the dynamic three dimensional (3D) manipulation of EM field polarization within the chamber and produces a uniform field distribution inside the chamber. The chamber includes one or more walls with tunable lumped elements. A controller is provided to generate one or more control signals that are applied to the lumped elements and tunes their impedance in response to the one or more control signals. The result is to generate, within the chamber an electromagnetic field that appears to be random or pseudorandom in polarization, but which is sufficiently uniform in magnitude for EM testing.

16 Claims, 15 Drawing Sheets

COMPACT ELECTRONIC REVERBERATION CHAMBER

The present application claims the benefit of priority from Provisional Patent Application No. 61/433,816 filed Jan. 18, 2011, which is incorporated herein by reference.

FIELD OF THE INVENTION

The present invention relates to a polarization controllable electromagnetic (EM) cell which is used to generate a uniform electric field environment for the electromagnetic compatibility/electromagnetic interference or immunity (EMC/EMI) testing of electronic equipment inside a reverberation chamber. In particular, the present invention is directed to a controllable electromagnetic cell that is capable of providing a wide range of electromagnetic frequencies, while at the same time requiring less electrical energy than those in the prior art.

BACKGROUND OF THE INVENTION

Reverberation chambers, also known as mode stirred chambers, have been viewed with increasing interest in electromagnetic (EM) related engineering research. Certain commonly-used electronic devices, such as cell phones, laptops or portable media players, as a few examples, may be immersed in a multipath environment in actual use and may, for example, experience faulty performance as a result of interference from various electromagnetic fields. A reverberation chamber may artificially generate a random or pseudo-random EM field distribution inside of a chamber to mimic an actual multipath environment that electronic equipment may encounter. Reverberation chambers are therefore becoming desirable for electromagnetic compatibility (EMC) measurements or electromagnetic immunity (EMI) assessments.

Currently, transverse electromagnetic (TEM) transmission-line cell devices are used for establishing a standard EM field in a shielded environment. TEM cells have raised more and more research interests in electromagnetic related engineering. Some daily use electronic devices, such as cellphones, laptops and portable media players are immersed in an electromagnetic interfering environment in real life. The reverberation chamber, which can generate uniform field distribution that mimics planar incident EM wave's in the real world, is increasingly critical to electromagnetic compatibility (EMC) measurements or electromagnetic immunity (EMI) assessments nowadays.

In the conventional TEM cell, the electric filed in the transverse section obeys a static field distribution, which can be calculated by solving the Laplace equation with voltages on the center conductor and ground as the boundary condition. When the electronic device is put in the TEM cell for EMC/EMI testing, EM waves with fixed polarization are directed to the device under test (DUT). Nevertheless, the overall EMC/EMI property of the DUT cannot be evaluated entirely in a test with a fixed polarization. One has to change the orientations of the DUT and repeat the measurement several times to fully characterize the DUT's EMC/EMI property.

Therefore, what is needed is a TEM cell which is able to generate a uniform field inside the cell that emulates the EM waves impinging on the commonly used electronic equipment in the real world. Furthermore, what is needed is a compact device that does not require orientation changes of the DUT in order to achieve a complete measurement of the EMC/EMI properties.

SUMMARY OF THE INVENTION

The present invention is directed to a device that generates an equivalent random or pseudo-random field environment for electromagnetic compatibility or immunity testing by employing a plurality of tunable electromagnetic surfaces to construct the walls of a reverberation chamber. By controlling the activation of each tunable surface, the device of the present invention is able to control the wave propagation direction and tune the polarization inside the reverberation chamber in three dimensions.

The preset invention is also directed to an improved reverberation chamber which facilitates the dynamic three dimensional (3D) manipulation of EM field polarization and produces a uniform field distribution inside the compact reverberation chamber. This improved reverberation chamber enables the fine control of field polarizations by altering the state of the tunable surfaces of the chamber without the need to rotate the DUT for different polarized wave illuminations.

BRIEF DESCRIPTION OF DRAWINGS

The foregoing and other features of the present invention will be more readily apparent from the following detailed description and drawings of illustrative embodiments of the invention in which.

DETAILED DESCRIPTION OF THE INVENTION

Figure 1:
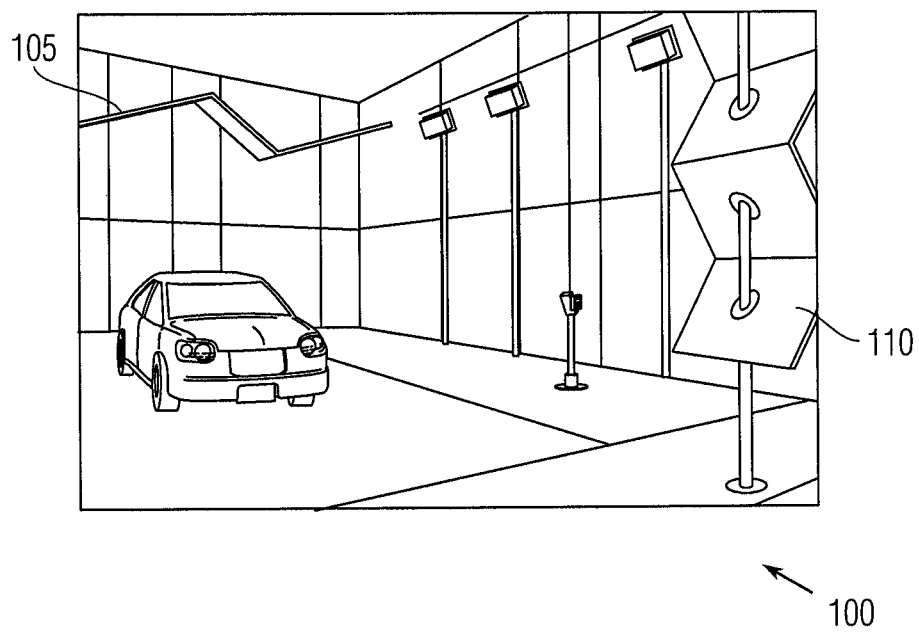
FIG. 1 is an image of a prior art Electromagnetic Effects Research Laboratory (EMERL) reverberation chamber at Nanyang Technological University in Singapore.

By way of overview and introduction, the present invention concerns a method and apparatus for providing an improved EM cell which facilitates the dynamic three dimensional (3D) manipulation of EM field polarization and produces a uniform field distribution inside its testing region. The present invention is further directed to a method and apparatus employing reconfigurable slot lines to control the propagation directions of the slot line mode and allow 3D polarization control of the EM field.

Some portions of the detailed description are presented in terms of algorithms or symbolic representations of operations on binary digital signals stored within a memory of a specific apparatus or special purpose computing device or platform. In the context of this particular specification, the term specific apparatus or the like includes a general purpose computer or other computing device once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here in, and generally, considered to be a self-consistent sequence of operations or similar signal processing steps leading to a desired result. In this context, operations or processing involves physical manipulation of physical quantities. Typically, although not necessarily, physical quantities may take the form of electrical or magnetic signals capable of being stored, transferred, combined, compared or otherwise manipulated.

It has proven convenient at times, principally for reasons of common usage, to refer to signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of a special purpose computer or similar special purpose electronic computing device. For example, a specific computing apparatus may comprise one or more processors programmed with instructions to perform one or more specific functions.

Reverberation chambers, which may comprise an electromagnetic shielding cavity enclosed by metallic walls, may be bulky in size. A reverberation chamber may stir or randomize a number of electromagnetic modes that may exist within a shielding enclosure to emulate actual use in an environment in which a host of electromagnetic interference is possible. Thus, it may be desirable for a cavity to allow for a variety of electromagnetic modes. Electromagnetic modes may effectively be stirred or randomized by metallic stirrers operating inside a shielding cavity, such as rotating paddles or fans, for example. Size may be a consideration for one or more stirrers to be able, for example, to affect or change an electromagnetic boundary condition. A testing or measuring environment for EMC or EMI, such as field uniformity or field randomness, may be generated within a reverberation chamber.

As seen in FIG. 1 (Prior Art), conventional EMERL reverberation chambers 100 chambers may be bulky in size. In practice, room-sized EMERL reverberation chambers 100 like those depicted in FIG. 1, form an electromagnetic shielding enclosure with six walls made of conductive materials. A working principle for this example is to mechanically stir a variety of electromagnetic modes (for this example, at least 60 modes) that exist within the reverberation chamber. Accordingly, conventional reverberation chambers, such as EMERL reverberation chamber 100, may be of a relatively large size so that a variety of modes can be generated. Electromagnetic modes within a reverberation chamber may be mechanically stirred by metallic stirrers so that a variety of modes result in a random or pseudo-random fashion. Stirrers (shown as a horizontal paddle 105 and vertical paddle 110 in FIG. 1) may also be constructed of a size to be able to affect or change an electromagnetic boundary condition of a chamber cavity or enclosure.

A working reverberation chamber may be able to generate an electromagnetic background where an electromagnetic or electric field within the reverberation chamber is spatially approximately uniform and approximately randomly or pseudo-randomly polarized. It is noted here that the terms "electromagnetic field" and "electric field" are used interchangeably throughout this document. It is desired for an electronic device under test (DUT) to be illuminated isotropically, e.g., approximately or roughly equivalently from various directions. If a working source is added to a conventional reverberation chamber, such as EMERL reverberation chamber 100, a number of electromagnetic modes may become excited. If perturbing structures (e.g., stirrers) move and rotate, an eigenfrequency of a given electromagnetic mode may shift continually, such that variation takes place in the mode field distribution.

Figure 2:
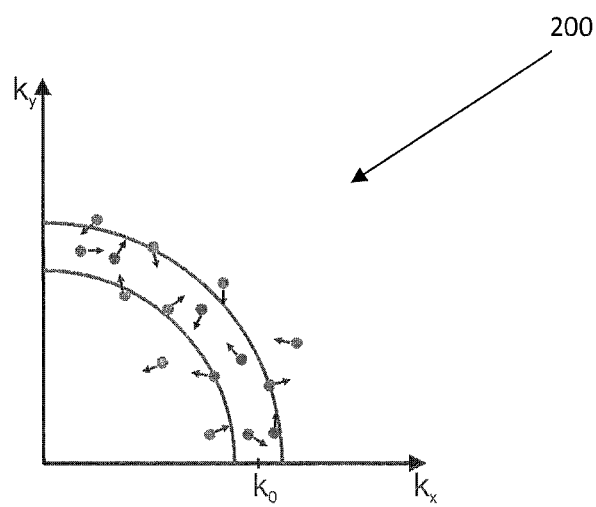
FIG. 2 is a plot of an electromagnetic mode distribution in the wave vector plane.

FIG. 2 is a plot of an electromagnetic mode distribution 200 in the wave vector plane such as may occur in connection with an embodiment of the present invention. The rotating or moving perturbing structures (stirrers) may give rise to shifts of eigenmodes, as shown in electromagnetic mode distribution 200. The amount of a shift may increase in relation to stirrer scale. Therefore, conventionally, stirrers are used in a conventional prior art reverberation chambers having sufficient size to result in an adequate shift. The amplitude of the excited electromagnetic modes may be tuned due to shifts of eigenmode frequencies. Therefore, random or pseudo-random fluctuations may occur and provide an average uniform field distribution in a reverberation chamber. For a conventional reverberation chamber, a lower operating frequency may indicate, for example, a longer wavelength and therefore, a larger enclosure or stirrer.

A reverberation chamber may also be understood by treating electromagnetic waves as rays, at least approximately. Thus, an electromagnetic field at any observation position may result from a superposition of rays generated in a complex multipath environment. Introduction of an electromagnetic mode stirrer may therefore effectively randomize ray paths.

One embodiment of the device described herein may utilize a phase shifting wall where a variation of tunable lumped elements is employed to alter or affect a surface impedance of a sub-domain of a phase shifting wall. Hence, a phase shift of a reflected wave from the wall is effectively altered from $-\pi$ to $+\pi$. Thus employing a phase shifting wall allows for the construction of a reverberation chamber of smaller scale as compared to conventional reverberation chambers with similar performance.

According to one or more implementations or embodiments of the illustrated device, a reverberation chamber that is relatively smaller in scale may be fabricated which may nonetheless generate an equivalent random or pseudo-random field environment for electromagnetic compatibility (EMC) or electromagnetic immunity (EMI) testing of electronic equipment as may be generated from a conventional reverberation chamber. For example, according to one or more implementations or embodiments, tunable electromagnetic surfaces may be utilized to fabricate walls to generate or produce electromagnetic boundary conditions for an electromagnetic field inside an enclosed region.

Conventionally, conducting plates are employed to build walls of a reverberation chamber. However, according to a particular implementation, for example, an electronic reverberation chamber is provided in accordance with claimed subject matter that may utilize tunable phase shifters instead. Although claimed subject is not limited in scope in this respect, for an embodiment, for example, size or scale may be smaller than is conventionally utilized for similar performance, and a technique other than mechanically moving stirrers may be applied, as discussed below.

Figure 3:
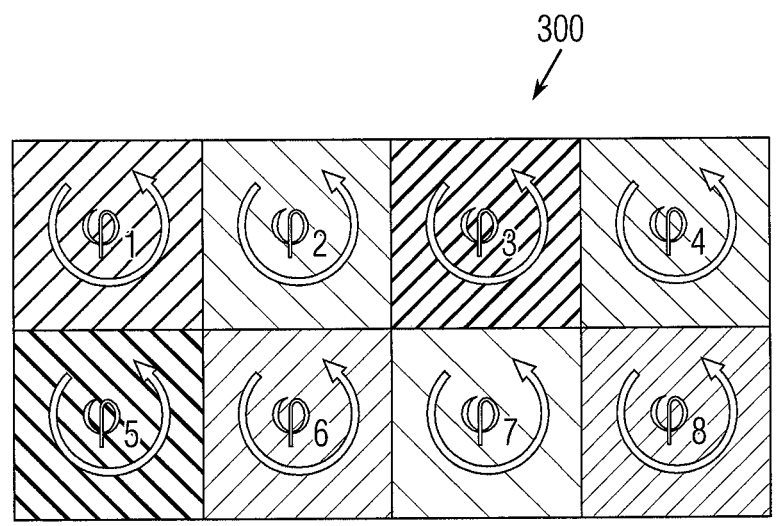
FIG. 3 is a schematic diagram of an embodiment of the present invention.

As seen in FIG. 3, a tunable phase shifting wall 300 is provided for as an element of the present invention. The tunable phase shifting wall 300 may be divided into several subdomains, which may be assigned a particular surface impedance $Z_i$ (i=1, 2, 3, ...). Hence, an electromagnetic wave impinging or incident upon a subdomain of tunable phase shifting wall 300 may be reflected with a particular phase shift $\phi_i$, as discussed in more detail below. Surface impedance $Z_i$ may be effectively tuned by an external system so that a reflective phase shift $\phi_i(t)$ may, for example, be time dependent and may vary in a range of $(-\pi, \pi)$; although, of course, claimed subject matter is not limited in scope in this respect. This is merely one illustrative embodiment.

In a particular embodiment of the described device, the tuning surface impedances may be flexible. For the sake of simplicity, however, the device in the illustrated embodiment maintains a consistent surface impedance across a variety of subdomains or tune surface impedances of subdomains in accordance with a particular pattern. According to an alternative embodiment, the device tunes surface impedances for particular subdomains independently, with possible values for $\phi_i(t)$ comprising $-\pi$ and $+\pi$ only. Thus, a variety of approaches to tuning may provide potential candidates to produce a random or a pseudo-random field distribution. However, it should be noted that some tuning strategies may have fewer degrees of freedom than more complicated tuning strategies. Nonetheless, simpler tuning functions of the illustrated device can provide satisfactory results for implementation or troubleshooting, while providing less complexity or cost. Likewise, usage or maintenance of the system described is less complex or less expensive than that in the existing prior art.

Tunable surfaces in at least one embodiment may be generally formed via distributive or lumped elements. In a particular embodiment, a physical realization of a phase shifting subdomain may be implemented, at least in part, by using metamaterials to form unit cells. In this context, the term "metamaterial" refers to a structure created to have properties not generally found in nature. For example, an electromagnetic metamaterial refers to a material or structure having electromagnetic properties not found in naturally occurring materials, which is discussed, e.g., in an article entitled "Metamaterials in the Sunshine" (Nature Materials 5 599), by Dr. John Pendry.

Figure 4:
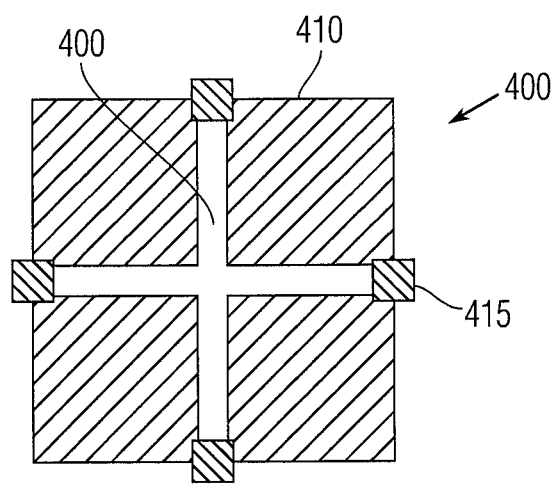
FIG. 4 is a schematic diagram of an example embodiment of an element of the present invention.

FIG. 4 illustrates an example an embodiment of the present device wherein a unit cell 400 is formed in accordance with metamaterial-type principles. In this embodiment, a particular cross structure is employed which generates or provides electromagnetic properties not naturally occurring. In the depicted embodiment, wherein the shielding enclosure is realized in accordance with a Faraday cage, the unit cell 400 is formed in accordance with the cross structure of metal material 405. In this embodiment, the cross structure metamaterial 405 is placed on top of another surface 410 (described below). Additionally, in the illustrated embodiment, a subdomain of a tunable phase shifting wall may be formed by multiple unit cells within a subdomain applying a particular tuning pattern.

Figure 5:
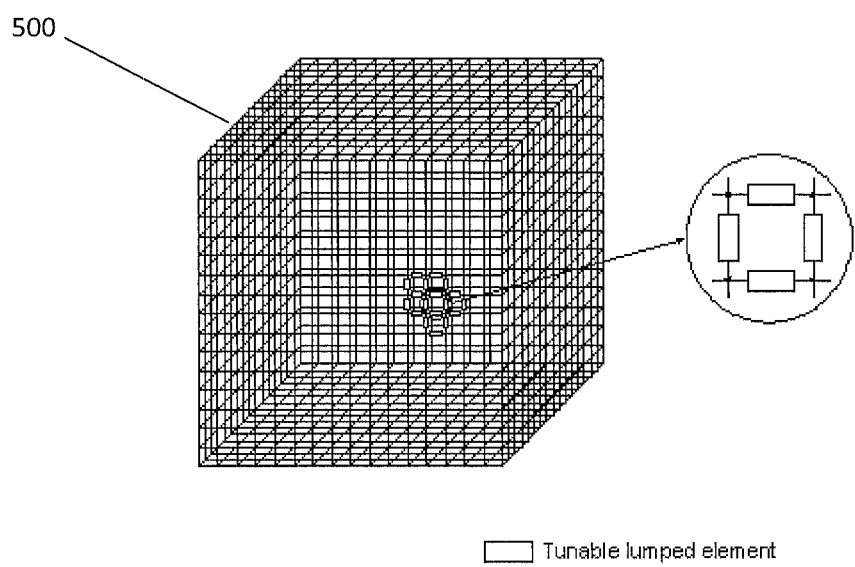
FIG. 5 is a schematic diagram of an embodiment of a portion of the present invention.

FIG. 5 is a schematic diagram of an embodiment 500 of an electronic reverberation chamber, for example, although the claimed subject matter, of course, is not limited in scope to this particular embodiment. In FIG. 5, the electronic reverberation chamber embodiment 500 may be based at least in part on application of a Faraday cage in conjunction with a unit cell structure 400, as was shown in FIG. 4.

As illustrated in FIG. 5, the electronic reverberation chamber device 500 of the present invention includes a Faraday cage of wire mesh. The electronic reverberation chamber 500, in this embodiment, can function similarly to a metal-mesh-screened window in the front of a microwave oven, which effectively keeps microwaves with a certain wavelength inside the chamber from escaping to an outside environment. In this particular embodiment, electromagnetic energy under a certain frequency range is trapped inside a wire mesh cage. However, a wire mesh structure may also effectively shield an interior of an electronic reverberation chamber embodiment 500 from external electromagnetic radiation if the mesh wires are thick enough and the holes are much smaller than a radiation wavelength. Furthermore, wire meshes may include lumped elements, such as varactor diodes, which may be electronically tuned. A variation of tunable lumped elements may alter or affect a surface impedance of a wire mesh, thereby altering or effecting a phase of a reflected wave from the wire mesh. In a specific embodiment, the wire mesh is coupled together with tunable lumped elements to operate as reflective phase shifters. In this embodiment, a random or pseudo-random electromagnetic field is generated inside a wire mesh cage if the phase shifters work effectively and the amount of phase shift imparted to reflected waves is varied.

Figure 6:
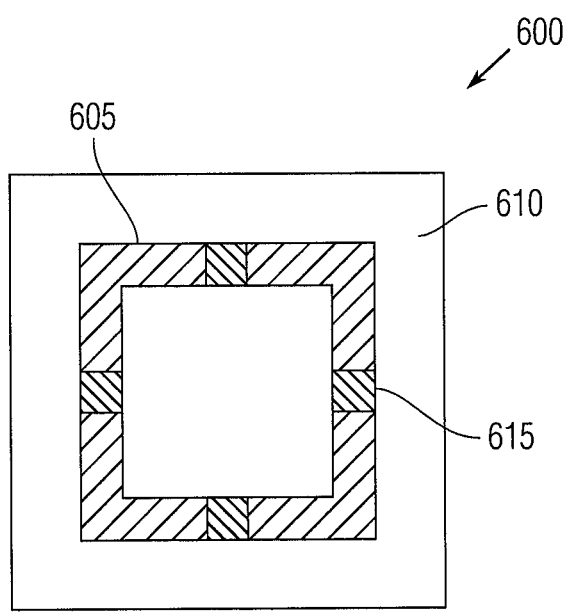
FIG. 6 is a perspective diagram of an example of an embodiment of a unit cell realized by a complementary square loop resonator.

FIG. 6 illustrates an exemplary embodiment 600 of a unit cell that is realized by a complementary square loop resonator. FIGS. 4 and 6 both illustrate slightly altered views of similar embodiments where metal material (405, 605) are placed or formed on top of another substance 410 and 610, such as a dielectric, a polymer or other insulating material. In the illustrated embodiment, a layer of metal is also placed on an opposing side of substances 410 and 610. Thus, substances 410 and 610 may be sandwiched between two metal layers. An embodiment of the illustrated device allows for the depicted structure to be realized by employing a printed circuit board (PCB) technique. A metal cross as shown in FIG. 4 may include tunable lumped elements 415, as explained in more detail below. Likewise, as illustrated in FIG. 6, tunable lumped elements 615 may be located on a square loop gap.

In one arrangement of elements of the present device, varactor diodes are utilized as tunable lumped elements 415 and 615. The capacitance of a varactor diode is generally a function of a voltage applied across terminals of the varactor diode. A reflective phase $\phi_i(t)$ of a subdomain of a tunable phase shifting wall may, for example, be tuned by varying the capacitance of varactor diodes, as explained below.

In addition to generating a random or pseudo-random electromagnetic field distribution, as described previously, the depicted embodiments may also be configurable to emulate a particular complex electromagnetic field distribution environment with an embodiment of an electronic reverberation chamber in accordance with claimed subject matter.

If a phase shifting wall is made lossy under a specific configuration, it may absorb an incoming wave within a certain frequency range. However, some electronic devices typically work at a single or narrow set of frequencies in practice. Thus, a wave-absorbing frequency range may be flexibly tuned for one or more implementations or embodiments. Thus, an embodiment of the present electronic reverberation chamber invention can be configured to perform single-frequency testing or measurement as an anechoic chamber (i.e., a chamber designed to stop reflections of electromagnetic waves) in addition to operation as a reverberation chamber. This provides a possibility of a multifunctional chamber for one or more embodiments.

As previously suggested, an embodiment comprising a reverberation chamber is illustrated in FIG. 5. For example, a metamaterial-type surface (such as a wire meshed Faraday cage) may be utilized to build a reverberation chamber. Moreover, linear or nonlinear lumped elements (e.g., either distributive or lumped, such as varactor diodes) may be loaded into the surface so as to make the surface impedance of a reverberation chamber tunable to control the electromagnetic field inside it. Electrically manipulated artificial surface boundary conditions may also be utilized to make a random or pseudo-random electromagnetic field internal to a chamber. Likewise, as suggested, an electromagnetic field distribution of a complex electromagnetic environment may also be emulated inside of a reverberation chamber. Under certain electrical conditions, (e.g., reverse bias applied to varactor diodes) a similar structure or configuration may also serve as an anechoic chamber.

As an example, the electronic reverberation chamber 500 of FIG. 5 is configured such that a phase shifting wall 300 shown in FIG. 3 is incorporated into the chamber. A unit cell in such a wall may be formed, for example, with a cross structure such as unit cell 400 of FIG. 4. A wire mesh may include varactor diodes with layers to form a sandwich structure as discussed above with respect to FIG. 4. Likewise, a voltage may be impressed on or applied to the varactor diodes.

Figure 7:
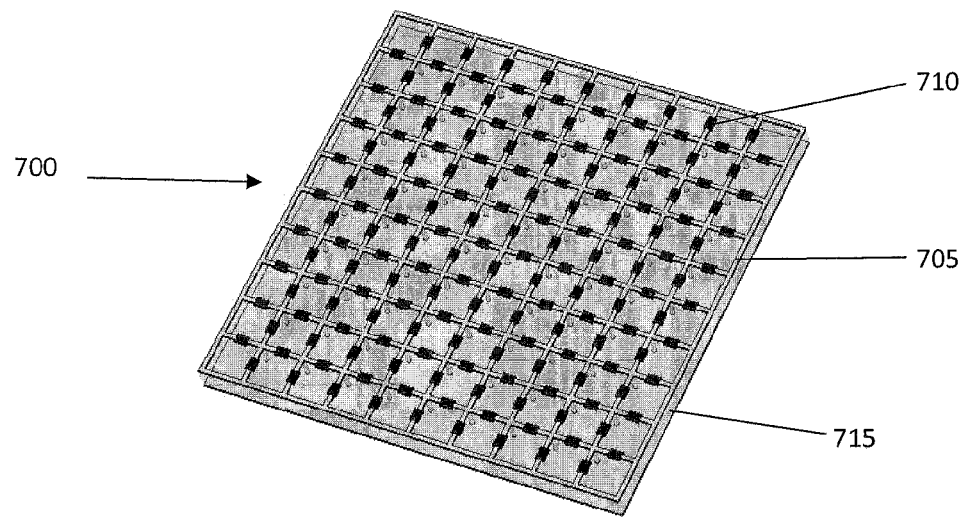
FIG. 7 is an illustrative perspective view of an embodiment of an element of the present invention.
Figure 8:
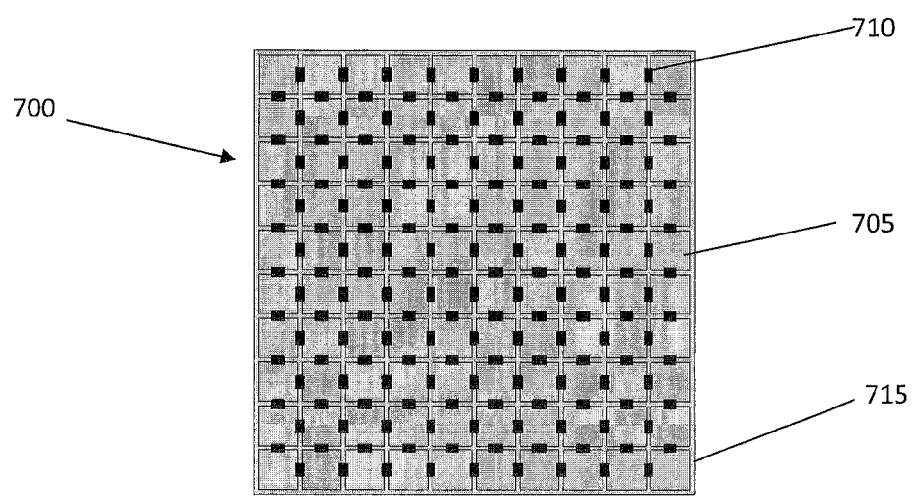
FIG. 8 is an illustrative top view of the embodiment depicted in FIG. 7.

FIGS. 7 and 8 illustrate perspective and top views, respectively, of an embodiment 700 of a phase shifting wall comprising a wire mesh 705 with varactor diodes 710 on a printed circuit board 715. In a particular embodiment of the present invention an electromagnetic wave impinging upon phase shifting wall 700 will induce electric currents to flow within wire mesh 705. An electric charge then flows around a path through wire mesh 705, varactor diodes 710, and via a metal plate located on the bottom of printed circuit board 715. Varactor diodes may have a variable capacitance that may be generally a function of a voltage applied across their terminals. In some implementations, of course, tunable lumped elements other than varactor diodes 710 may be used, such as discussed below, for example.

Figure 9:
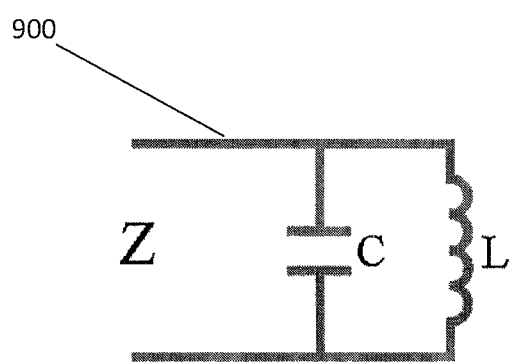
FIG. 9 is a schematic diagram of an embodiment of a parallel resonant LC circuit.

FIG. 9 illustrates an element of the present invention incorporating a parallel resonant LC circuit 900. The parallel resonant LC circuit 900 may be used to approximate a phase shifter if a size of a unit cell of a phase shifting wall is sufficiently smaller than a working wavelength. In a given embodiment, if a unit cell of size 1 cm were to approximate a phase shifter, then a wavelength of 10 cm or more may be employed with it. For example, a surface impedance Z may be realized for a surface of a phase shifting wall in which the phase shifting wall has an equivalent lumped impedance value.

Since a reflective phase $\phi$ may be a function of impedance, $$\varphi = \operatorname{Im}\left\{\ln\left(\frac{Z-\eta}{Z+\eta}\right)\right\}$$

where $$Z = \frac{j\omega L}{1 - \omega^2 LC}$$

and $$\eta = \sqrt{\frac{\mu_0}{\varepsilon_0}},$$

one may produce a reflective phase $\phi$ by adjusting a capacitance of varactor diodes in a phase shifting wall. A rectangular metallic cavity with one of its walls emulating sinusoidally oscillating movement with the others staying static may be able to achieve an approximately uniform electromagnetic field distribution inside the reverberation device, if the emulated oscillation magnitude produced by a phase shifting wall is comparable to or on the order of a working wavelength.

One given embodiment of the present device is capable of implementing an emulated oscillating wall as an effective phase shifter, which is stationary in position but supplies different reflective phases at different moments. As a result, the present device provides an emulated mechanical oscillation frequency of a phase shifting wall that may be much lower than a carrier frequency of an electromagnetic wave inside the reverberation device, resulting in a slow varying envelope of an electric field at some observation points. However, the envelope may appear to be random due at least in part to the different reflective phases at different moments, assuming again, that the magnitude of an emulated wall oscillation is no shorter than the working wavelength. The stronger the oscillation, the more chaotic or random a field may appear. For example, a longer travelling path introduced by a phase shifting wall to an electromagnetic wave may lead to a larger phase shift if both incident and reflective waves have fixed positions.

As a consequence, an embodiment of the present device is capable of providing an electronic reverberation chamber that produces a relatively large phase shift by employing tunable lumped elements even if the size of the electronic reverberation chamber is comparable to its working wavelength. Thus, one may make an embodiment of an electronic reverberation chamber having a smaller scale than a convention reverberation chamber.

Figure 10:
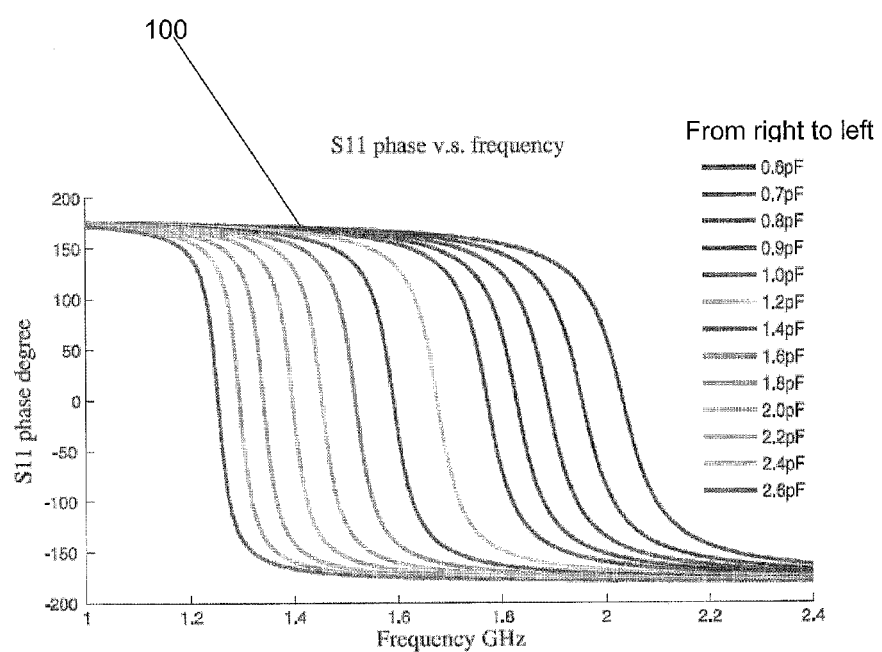
FIG. 10 is a chart of a simulated phase portion of an S11 scattering parameter of an embodiment of a complementary square loop resonator unit cell.

FIG. 10 Illustrates a chart 1000 of simulated signal values for the phase portion of an S11 scattering parameter of an embodiment of a complementary square loop resonator unit cell such as shown in FIG. 6. As shown in chart 1000, a reflective phase may be adjusted at least approximately from −180 degrees to +180 degrees by tuning a capacitance of varactor diodes of a phase shifting wall from 0.6 pF to 2.6 pF in the frequency range which goes from 1.25 GHz to 2 GHz. A finite difference time domain (FDTD) method may be utilized to evaluate if a design in accordance with FIGS. 3-8 is sufficiently uniform, such as in accordance with the International Electrotechnical Commission (IEC) standard.

An EMC test in a reverberation chamber may comprise independent subtests. A subtest may be conducted in different electromagnetic environments. In a conventional reverberation chamber conditions may be realized by changing or adjusting the positions of moving parts, such as by rotating metallic stirrers or paddles by several degrees. Thus, one measurement sample may be obtained which contains information such as electromagnetic field intensity and polarization recorded at several observation points for a subtest. After subtests are conducted, measurement results may be averaged over samples and statistical electromagnetic analysis may be applied, which may be useful for electromagnetic problems with complicated time-varying boundary conditions.

Uniformity may be used as a measure or index of performance of a reverberation chamber. Eight points in a reverberation chamber may be chosen to form a rectangular working volume, which may also be called a "volume of uniform field," Eight vertices (i=1, 2, . . . 8) may be chosen to be observation points. In some cases, if an electromagnetic field appears relatively uniformity over vertex observation points, it suggests that an electromagnetic field generated in the working volume may be likely to be sufficiently uniform.

N samples may be denoted during a stirrer rotation as $\theta=\theta_1$, $\theta_2, \ldots \theta_N$. An extreme value for a single-axis electric field component ($\tilde{E}_{\xi,i}$ where $\xi=x, y, z$) at an observation point ($x_i$, $y_i$, $z_i$) during a rotation is $$\tilde{E}_{\xi,i} = \max_{\theta_j=\theta_1,\theta_2,\ldots,\theta_N} |E_\xi(x_i, y_i, z_i)|_{\theta_j}.$$

Standard deviations for electric field components may be calculated as $$\sigma_\xi = \sqrt{\frac{\sum_{i=1}^{8} \tilde{E}_{\xi,i} - \langle \tilde{E}_\xi \rangle}{8-1}}$$

where $$\langle \tilde{E}_\xi \rangle = \frac{1}{8}\sum_{i=1}^{8} \tilde{E}_{\xi,i}.$$

A decibel notation may be used to obtain a more convenient expression $$\tilde{\sigma}_\xi = 20\log_{10} \frac{\sigma_\xi + \langle \tilde{E}_\xi \rangle}{\langle \tilde{E}_\xi \rangle}.$$

A decibel notation may also be applied to a magnitude $$|E(x_i,y_i,z_i)|_{\theta_j} = \sqrt{|E_x|^2+|E_y|^2+|E_z|^2}|_{\theta_j}^{(x_i,y_i,z_i)}.$$

For acceptable mode stirring, standard deviations $\tilde{\sigma}_\xi$ plotted against frequency should lay, for example, below a tolerance level for compliance with an IEC standard. In other words, if the working frequency of a reverberation chamber is in a range of 80 MHz to 100 MHz, $\tilde{\sigma}_\xi$ should be less than 4 dB. If the working frequency goes from 100 MHz to 400 MHz, $\tilde{\sigma}_\xi$ should decrease linearly from 4 dB to 3 dB. If the working frequency is above 400 MHz, $\tilde{\sigma}_\xi$ should be less 3 dB. Within these parameters, field distribution within a reverberation chamber may be considered sufficiently uniform.

The reverberation chamber embodiment 500, as shown in FIG. 5, may be simulated by an extended. FDTD method which accounts for lumped elements by adding a lumped electric current density term to conduction and displacement currents in Ampere's law formulation. For example, dimensions of a simulated electronic reverberation chamber along x, y and z axes in one implementation may comprise 52 cm, 60 cm and 68 cm. Assume a computational space of 28×32× 36 FDTD unit grids and that a unit grid comprises a cube which has a 2 cm side-length. A proposed reverberation chamber simulation may occupy 26×30×34 grids. A rectangular working volume determined by eight observation points may occupy 16×20×24 grids. A reverberation chamber and a working volume may have a coincident center located at position (14, 16, 18) in an FDTD coordinate system. A delta pulse source may be added to field components $E_x$, $E_y$, $E_z$ at position (5, 5, 5) during a beginning portion of a simulation.

One of the two chamber faces which are normal to an X-axis may be replaced with a phase shifter plane and an electric conductor boundary condition may be set to the remaining five chamber faces since a reverberation chamber comprises a shielding structure. As discussed before, varactor diodes on a phase shifter plane may obey a similar time-varying pattern for simplicity in design and manipulation. In this simulation, for example, 62 numerical subtests may be conducted to generate 62 samples. A fixed capacitance may be applied to the varactor diodes during a particular subtest, but capacitances in 62 subtests may be different from each other. Therefore, 62 non-repetitive samples corresponding to 62 capacitance values may be obtained, which is similar to a case in a conventional reverberation chamber where 62 different stirrer positions may be employed. In a sample of this simulation, an application program may run for 65,536 FDTD time-steps to achieve stability and a fast Fourier transform may be employed to acquire frequency domain signal value information.

If a phase shifting wall is added to a reverberation chamber and varactor diodes have DC voltages carefully applied during an iteration, a substantially or sufficiently uniform field distribution in a working volume may be obtained. In the simulation discussed above, 62 simulation samples were acquired.

Figure 11:
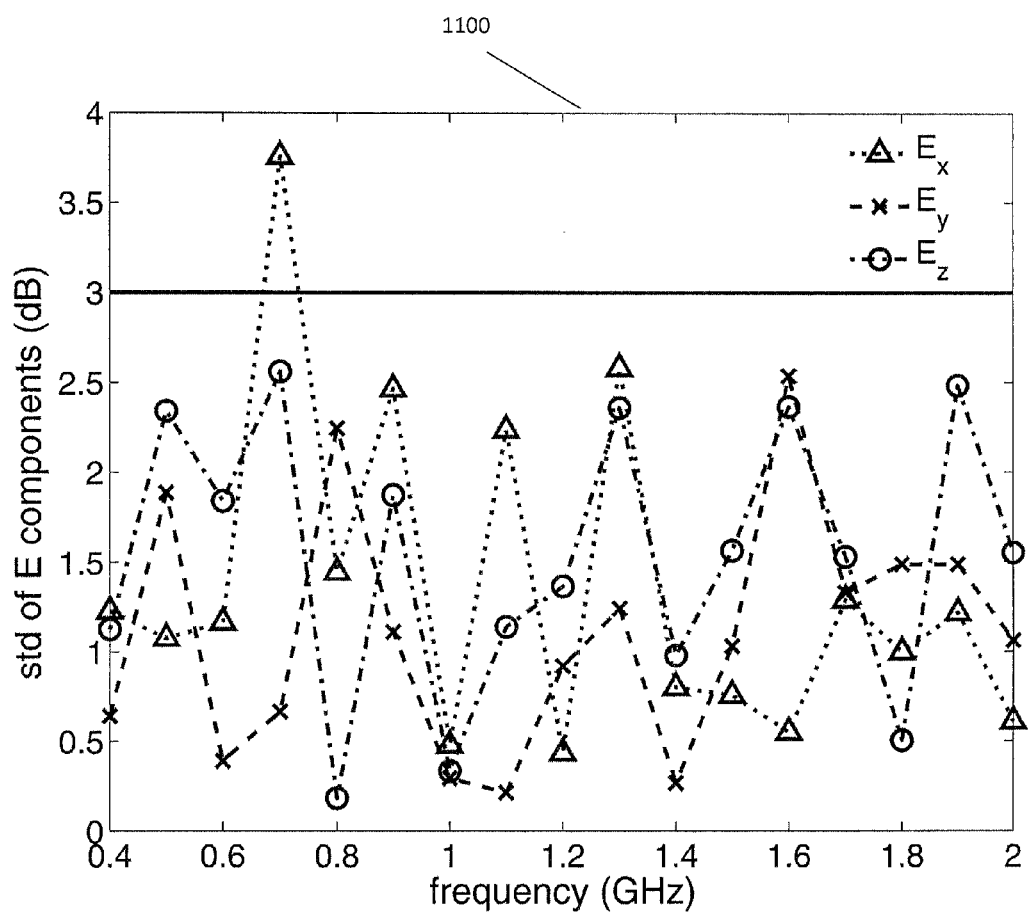
FIG. 11 is a plot showing standard deviation of an electromagnetic field amplitude against frequency for an embodiment of an electronic reverberation chamber.
Figure 12:
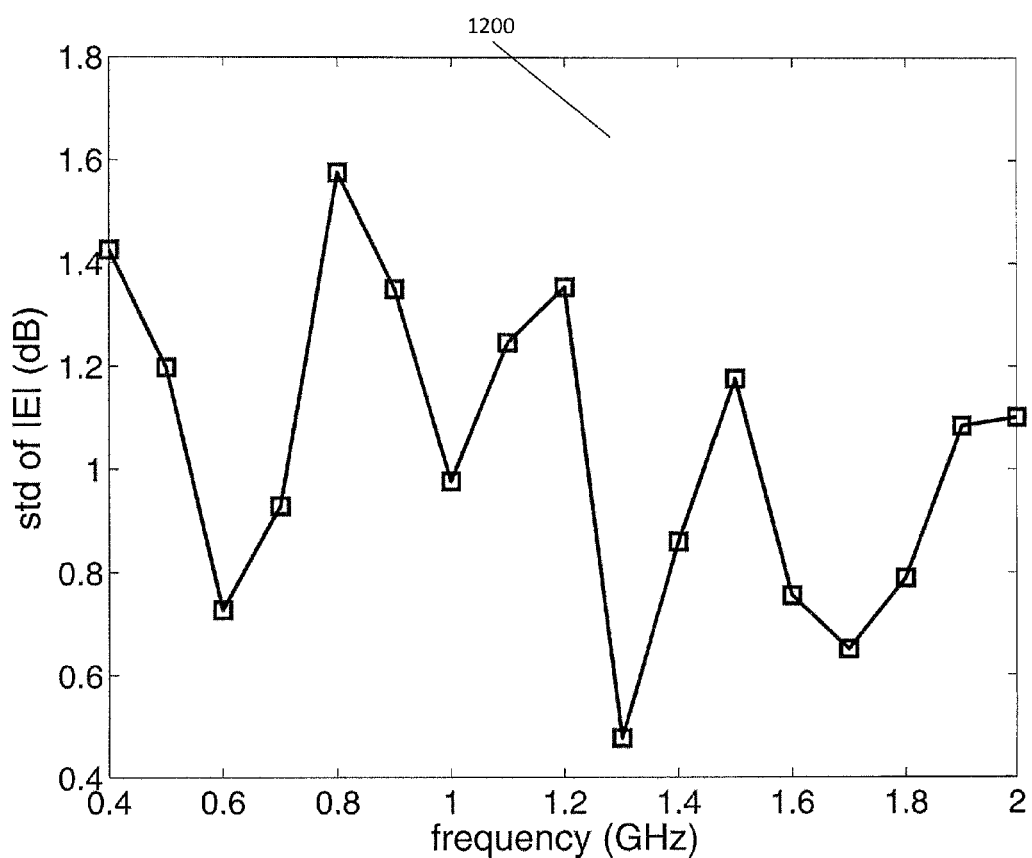
FIG. 12 is a plot depicting standard deviation of an electromagnetic field amplitude against frequency for an embodiment of an electronic reverberation chamber.

FIG. 11 is a plot 1100 of standard deviations of each electric field component against frequency for an embodiment of an electronic reverberation chamber in accordance with the claimed subject matter. FIG. 12 is a plot 1200 of standard deviations of a magnitude of an electric field against frequency for an embodiment of an electronic reverberation chamber in accordance with the claimed subject matter.

As shown in plots 1100 and 1200, sufficient uniformity is achieved and IEC standards are reached in most cases. In other words, an embodiment of a reverberation chamber in accordance with the claimed subject matter works well for a relatively large bandwidth. Simulation results suggest that a sufficiently uniform field distribution may be realized by tuning varactor diodes of a phase tuning wall using a simple pattern.

To achieve a large working volume, which may be desirable in some situations, the bias voltage for tunable lumped elements may be sampled from the capacitor voltage in a Chua's circuit. Thus, a varying pattern of varactor diodes may appear as a greater amount of pseudo-randomness within a reverberation chamber. Likewise, it is not necessary for the varactor diodes to behave with the same pattern. Different capacitances may be applied to different varactor diodes on a plane. In an application, six phase shifter planes may be utilized to form an enclosure if desired, for example, since a reverberation chamber may have a subwavelength effect that lowers a resonant frequency.

Figure 13:
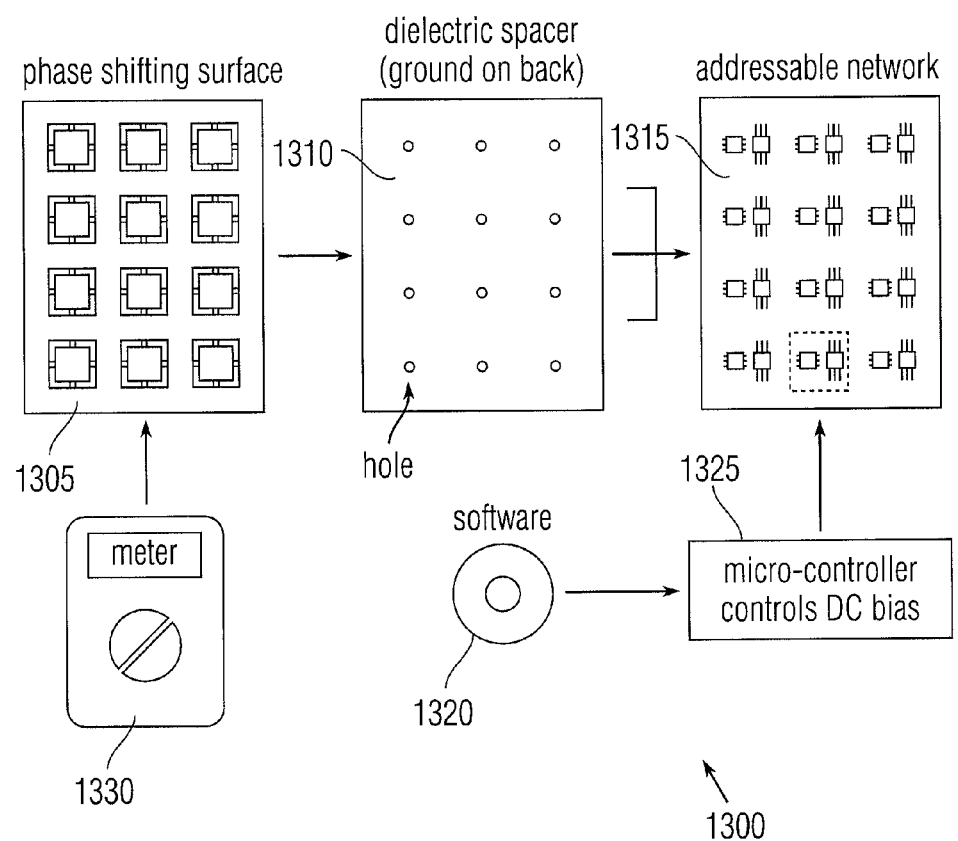
FIG. 13 is a schematic diagram detailing elements of an embodiment of the present invention.

FIG. 13 illustrates an embodiment of an addressable phase shifting wall system 1300. Addressable phase shifting wall system 1300 may comprise a phase shifting surface 1305, a dielectric spacer (ground on back) 1310, an addressable network 1315, and software or programming instructions 1320 to be executed by a micro-controller 1325 to affect a DC bias. Addressable phase shifting wall system 1300 may also include a meter 1330 to monitor electromagnetic field properties. Local phase properties of phase shifting surface 1305 may be achieved by manipulating individual complementary square loop resonator unit cells such as those shown in FIG. 6. An embodiment employing this structure achieves a performance comparable to a wire net structure shown in FIGS. 7 and 8. In an alternative arrangement of the illustrated elements individual complementary square loop resonator unit cells are fabricated and used.

As seen in FIG. 13, a top layer of addressable phase shifting wall system 1300 may incorporate several square loop apertures, which may include up to four varactor diodes so that a relatively larger tuning range may be achieved. A structure may function reasonably well regardless of whether an incident wave is horizontally or vertically polarized. An example of a suitable varactor diode includes product SMV 1405 from Skyworks™. A metallic portion in a top layer may comprise copper or aluminum, for example. Dielectric spacer 1310 (such as, e.g., an FR-4 PCB Laminate) may include several holes beneath a top layer and may include a copper ground on its back. FR-4 PCB Laminate refers to a commonly used base material for printed circuit boards. The abbreviation "FR" indicates "Flame Retardant," and Type "4" indicates a woven glass reinforced epoxy resin. Another layer on a control board may comprise addressable network or circuitry 1315. On a control board, several micro-controllers 1325 may be included which may be designed to manipulate a DC bias applied to varactor diodes of a unit cell.

Figure 14:
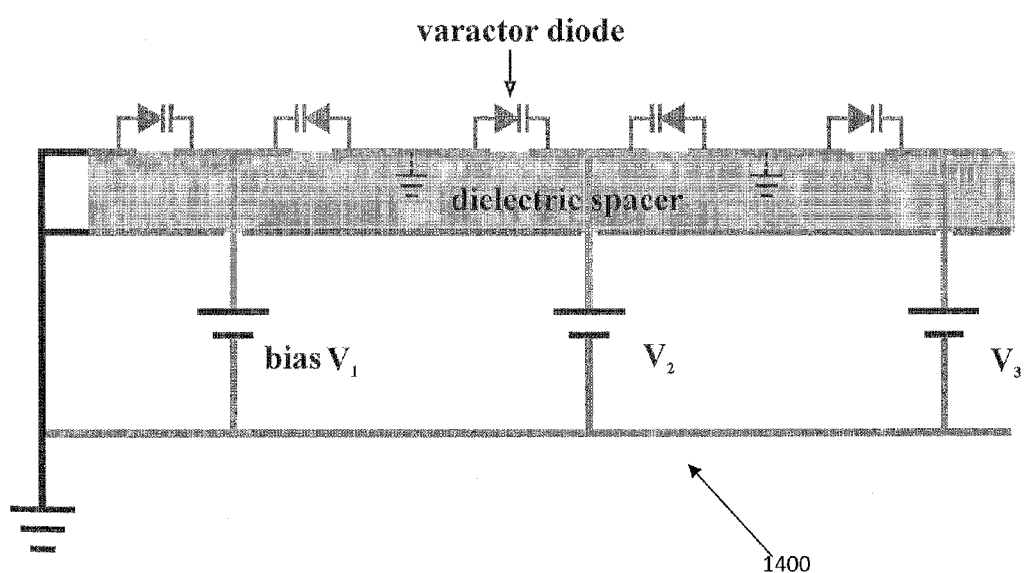
FIG. 14 is a side view of a schematic diagram of an embodiment of the present invention.

FIG. 14 illustrates a side view of an embodiment of an addressable phase shifting wall 1400. FIG. 14 illustrates that holes may be drilled from the bottom to the top so that varactor diodes may be independently biased.

Micro-controller 1325 shown in FIG. 13 may comprise a digital potentiometer, an operational amplifier and some surface mounted resisters which may isolate an amplifier output bias from an induced radio frequency current. Signals may be generated in accordance with software 1320 and may be applied to individual potentiometers. An output range of a potentiometer may typically not be broad enough to access a full capacitance tuning range of an SMV 1405 varactor diode. Thus, an operational amplifier may be utilized and an output signal of the operation amplifier may be utilized as a reverse bias to be applied to varactor diodes.

Figure 15:
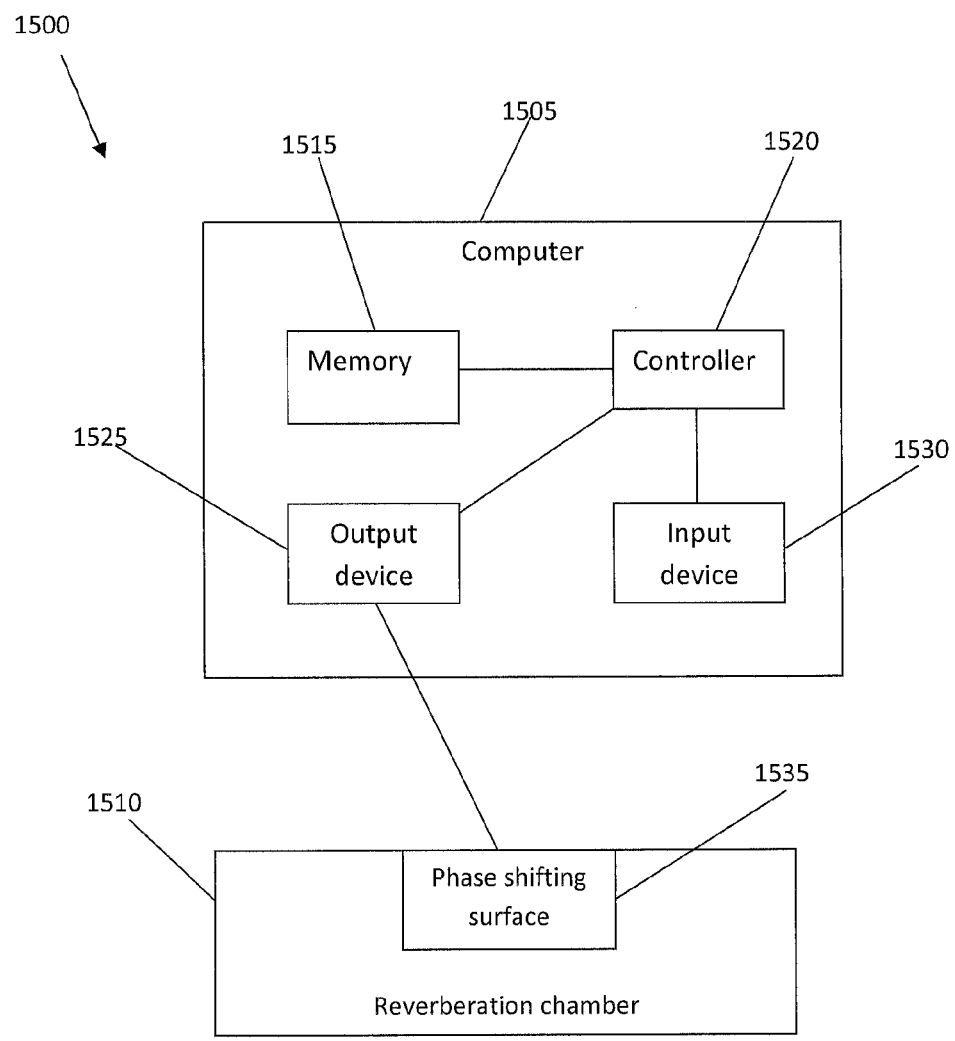
FIG. 15 is a block diagram depicting an embodiment of the present invention and interrelated components thereof.

FIG. 15 is a block diagram of an embodiment 1500 comprising a computer 1505 for controlling an electromagnetic field within a reverberation chamber 1510. Computer 1505 may include several elements, such as memory 1515, controller 1520, output device 1525, and input device 1530. Memory 1515 may store machine-readable instructions executable by controller 1520. Controller 1520 may generate one or more control signals to control an electric field within reverberation chamber 1510. Input device 1530 may, for example, include a computer mouse, stylus, track ball, keyboard, or any other device capable of receiving an input from a user or another device. Output device 1525 may transmit one or more control signals generated by controller 1520 to a phase shifting surface 1535 of reverberation chamber 1510.

Phase shifting surface 1535 may comprise one or more tunable lumped elements that are tunable in response to one or more control signals. Tunable lumped elements may be tunable to generate, within an enclosure, an electromagnetic field that appears to be random or pseudo-random in polarization, but which is sufficiently uniform in magnitude. In one or more embodiments, reverberation chamber may comprise an enclosure having one or more walls and phase shifting surface 1535 may be disposed on at least one of the one or more walls.

An embodiment of a reverberation chamber may include six phase shifting walls. There may be a number of unit cells in a reverberation chamber. To maintain a good working status of a reverberation chamber, a simple but robust diagnostic circuit may be added to the micro-controllers. A working condition may be indicated by a small indicator light. If a chip or nonlinear lumped portion, such as a varactor diode, breaks down, a corresponding light may become illuminated. An examining meter may also be utilized to check lumped elements from time to time, in case a diagnostic subsystem fails. The present invention also incorporates a method of using the apparatus so described to carry out and achieve the function of creating, maintaining and modulating a uniform electric field environment for EMC/EMI testing of electronic equipment. Such a method involves, but is not limited to, a generating step wherein one or more control signals is generated by a signal generator. A transmitting step is also provided for transmitting the one or more control signals to one or more tunable lumped elements, wherein the one or more tunable lumped elements are tunable in response to the one or more control signals to generate, within an enclosure, an electromagnetic field appearing to be random or pseudo-random in polarization, but which is sufficiently uniform in magnitude. The present method also includes an optional second transmitting step, wherein the transmission of one or more control elements to tune the one or more tunable elements to alter or affect a surface impedance of at least a portion of one or more walls of the enclosure is performed.

The above processing functions can be operating as a series of programmed steps preformed by a properly configured computer system using one or more modules of computer-executable code. For instance, a set of software modules can be configured to cooperate with one another to configure a processor so that when executed they provide accurate control of various modules designed to control the aforementioned functions.

As discussed above, an embodiment of a reverberation chamber may be employed to generate a random or pseudo-random electromagnetic field environment for EMC/EMI testing of electronic equipment or devices. An embodiment of a reverberation chamber in accordance with the claimed subject matter may have benefits over conventional approaches. For example, size may be reduced and mechanical structures (e.g., stirrers such as metal paddles or fans) may not be required. Further, one embodiment may use a tunable electromagnetic surface to generate internal electromagnetic fields in a specific region. A tunable surface may be generated using linear and nonlinear electronic elements (e.g., distributive and lumped).

According to one or more implementations of the described method and apparatus, a metamaterial-type tunable phase shifting wall may produce a surface impedance of a subdomain on the wall by engaging in a tuning step wherein a tuning voltage is impressed on corresponding tunable lumped elements (e.g., such as varactor diodes). Thus, a subdomain generates a reflective electromagnetic wave with a phase adjustment in a range from −180° to +180° within a relatively large bandwidth. An embodiment of a reverberation chamber may, for example, supply a relatively complicated time varying impedance boundary condition to an electromagnetic field leading to a random or pseudo-random electromagnetic field distribution to emulate an actual multipath environment.

Methods described herein may be implemented by various approaches depending at least in part upon the desired applications according to particular features or examples. For example, methodologies may be implemented in hardware, firmware, software, or any combinations thereof. However, it is not intended that claimed subject matter cover software per se. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, or other device units designed to perform functions, such as those described herein or any combinations thereof.

Likewise, in some embodiments, methods may be implemented with modules (e.g., procedures, functions, and so on) that perform functions described herein or any combination thereof. Any machine readable medium tangibly embodying instructions may be used, for example. In an embodiment, for example, software or code may be stored in a memory and executed by a processing unit. Memory may be implemented within a processing unit or external to the processing unit. As used herein the term "memory" refers to any type of long term, short term, volatile, nonvolatile, or other memory and is not to be limited to any particular type of memory, number of memories, or any type of media used for creating a memory.

Likewise, a storage medium may take the form of an article of manufacture. A storage media may comprise any available media that may be accessed by a computer, computing platform, computing device, or the like. By way of example, but not limitation, a computer-readable or machine-readable medium may comprise RAM, ROM, EEPROM, CD-ROM or other optical disk storage, magnetic disk storage or other magnetic storage devices, or any other medium that may be used to carry or store desired program code in the form of instructions or signal sample values that may be accessed by a computer, computing platform or computing device.

While there has been illustrated or described what are presently considered to be exemplary features, it will be understood by those skilled in the art that various other modifications may be made, or equivalents may be substituted, without departing from claimed subject matter. Additionally, many modifications may be made to adapt a particular situation to teachings of claimed subject matter without departing from concepts described herein. Therefore, it is intended that the claimed subject matter not be limited to particular examples disclosed, but that such claimed subject matter may also include all aspects falling within the scope of appended claims, or equivalents thereof.

What is claimed is:

1. An apparatus, comprising:
    more than one wall arranged to form an enclosure;
    a controller to generate one or more control signals; and
    one or more of said walls acting as a tunable phase shifting wall that is tunable in response to the one or more control signals to controllably phase shift electromagnetic waves reflected therefrom in order to generate, within the enclosure, an electromagnetic field that has random or pseudo-random polarization and sufficiently uniform magnitude.

2. The apparatus of claim 1, wherein at least one of said one or more walls acting as said tunable phase shifting wall comprises a plurality of lumped phase shifting elements that are tunable in response to said one or more control signals in order to modify the phase shift of the wall.

3. The apparatus of claim 1, wherein the phase shifting walls are arranged in a regular mesh and thereby comprise a conductive mesh material.

4. The apparatus of claim 2, wherein the one or more tunable lumped phase shifting elements is tunable to alter or affect a surface impedance of the region around a portion of the one or more walls where the tunable element is mounted.

5. The apparatus of claim 4, wherein the one or more tunable lumped elements comprises at least one varactor diode.

6. The apparatus of claim 2, wherein the one or more phase shifting walls are divided into multiple subdomains with respective surface impedances and tunable lumped phase shifting elements are grouped within the subdomains.

7. The apparatus of claim 6, wherein the multiple subdomains of the one or more walls comprise a cell structure.

8. The apparatus of claim 7, wherein the cell structure comprises a cross structure comprising a metal layer disposed on opposing sides of the cell structure.

9. The apparatus of claim 7, wherein the cell structure comprises a complimentary square loop resonator.

10. The apparatus of claim 1, wherein the enclosure comprises a Faraday cage.

11. The apparatus of claim 2, wherein each tunable phase shifting wall comprises an electromagnetic meta-material inspired structure that is tunable and may be resonant to the electromagnetic field within the enclosure; and
    wherein said one or more tunable lumped elements may be modeled on an LC resonant circuit, and are tunable to sufficiently randomize the electromagnetic field within the enclosure and to emulate an electromagnetic field distribution of a complex electromagnetic environment within the enclosure.

12. A method to actively control a phase shifting element on at least one phase shifting wall of an enclosure having more than one wall, comprising the steps of:
    generating one or more control signals; and
    transmitting the one or more control signals to respective phase shifting elements on the phase shifting walls,
    wherein the one or more phase shifting elements are tunable in response to the one or more control signals to controllably phase shift electromagnetic waves reflected therefrom in order to generate, within the enclosure, an electromagnetic field appearing to be random or pseudo-random in polarization but sufficiently uniform in magnitude.

13. The method of claim 12, further comprising transmitting the one or more control signals to tune the one or more tunable phase shifting elements to alter or affect a surface impedance of at least a portion of said one or more phase shifting walls of the enclosure around the area of the corresponding phase shifting elements so as to resemble the function of rotating stirrers in conventional reverberation chambers.

14. The method of claim 12, wherein the enclosure comprises a Faraday cage.

15. An article, comprising:
    a non-transitory storage medium comprising machine-readable instructions executable by a special purpose apparatus to:
    generate one or more control signals; and initiate transmission of the one or more control signals to one or more tunable lumped elements of a phase shifting wall of an enclosure, wherein the one or more tunable lumped elements are tunable in response to the one or more control signals to controllably phase shift electromagnetic waves reflected therefrom in order to generate, within the enclosure, an electromagnetic field appearing to be random or pseudo-random in polarization, but sufficiently uniform in magnitude.

16. The article of claim 15, wherein the machine-readable instructions are further executable by the special purpose apparatus to initiate control of the one or more control signals to tune the one or more tunable elements to alter or affect a surface impedance of at least a portion of the one or more phase shifting walls of the enclosure where the element is mounted.

* * * * *